United States Patent
Bresalier et al.

(10) Patent No.: US 8,271,848 B2
(45) Date of Patent: Sep. 18, 2012

(54) METHOD OF DECODING CODE BLOCKS AND SYSTEM FOR CONCATENATING CODE BLOCKS

(75) Inventors: Robert David Bresalier, New Providence, NJ (US); Francis Dominique, Rockaway, NJ (US); Emad N. Farag, Flanders, NJ (US); Hongwei Kong, Denville, NJ (US)

(73) Assignee: Alcatel Lucent, Paris (FR)

( * ) Notice: Subject to any disclaimer, the term of this patent is extended or adjusted under 35 U.S.C. 154(b) by 926 days.

(21) Appl. No.: 11/398,535

(22) Filed: Apr. 6, 2006

(65) Prior Publication Data

US 2007/0250753 A1 Oct. 25, 2007

(51) Int. Cl.
*H03M 13/00* (2006.01)
(52) U.S. Cl. .......................................................... 714/755
(58) Field of Classification Search .................. 714/755, 714/795, 760, 791
See application file for complete search history.

(56) References Cited

U.S. PATENT DOCUMENTS

| | | | | |
|---|---|---|---|---|
| 6,392,572 B1* | 5/2002 | Shiu et al. | | 341/81 |
| 6,397,367 B1* | 5/2002 | Park et al. | | 714/786 |
| 6,614,369 B1* | 9/2003 | Widmer | | 341/59 |
| 6,731,700 B1* | 5/2004 | Yakhnich et al. | | 375/341 |
| 6,968,021 B1* | 11/2005 | White et al. | | 375/340 |
| 2006/0126591 A1* | 6/2006 | Bysted et al. | | 370/345 |
| 2006/0212781 A1* | 9/2006 | Hewitt et al. | | 714/780 |
| 2007/0072652 A1* | 3/2007 | Shan et al. | | 455/570 |
| 2007/0189248 A1* | 8/2007 | Chang et al. | | 370/338 |
| 2008/0019263 A1* | 1/2008 | Stolpman | | 370/210 |

OTHER PUBLICATIONS

Sayana, K, A concatenated coded multiplexing scheme for multiuser OFDM downlink, May 2003, IEEE, vol. 4, pp. 2848-2851.*

* cited by examiner

*Primary Examiner* — M. Mujtaba K Chaudry
*Assistant Examiner* — Enam Ahmed
(74) *Attorney, Agent, or Firm* — Harness, Dickey & Pierce, P.L.C.

(57) ABSTRACT

In a multiple access environment, to improve decoding efficiency for small code blocks by a constituent decoder, multiple code blocks may be concatenated to form a single larger code block. Example embodiments of the present invention concatenate code blocks for turbo codes I and II. Example embodiments of the present invention may also concatenate code blocks for convolutional code. Example embodiments of the present invention also disclose a system to concatenate the code blocks.

18 Claims, 7 Drawing Sheets

FIG. 8A

| code block 1, systematic bits | LLR= -8, Extrinsic=-32 | LLR= -8, Extrinsic=-32 | LLR= -8, Extrinsic=-32 | code block 2, systematic bits |
|---|---|---|---|---|
| | guard systematic bits 0 | guard systematic bits 1 | guard systematic bits 2 | |

FIG. 8B

| code block 1, parity bits | LLR= -8 | LLR= -8 | LLR= -8 | code block 2, parity bits |
|---|---|---|---|---|

FIG. 9

| code block 1 | LLR= -8 | LLR= -8 | ... ... ... | LLR= -8 | code block 2 |
|---|---|---|---|---|---|
| | guard bits0 | guard bits1 | | guard bits15 | |

16 guard-bits with LLR set to the maximum allowed amplitude for bit=0

METHOD OF DECODING CODE BLOCKS AND SYSTEM FOR CONCATENATING CODE BLOCKS

BACKGROUND OF THE INVENTION

Forward error correcting (FEC) channel codes have been used to effectively improve wireless communication systems. Systems using FEC codes can tolerate more channel errors. Therefore, such coded systems may operate with lower transmit power, transmit over longer distances, tolerate more interference, use smaller antennas, and transmit at a higher data rate.

FEC codes include convolutional code, Turbo code, and Trellis code modulation (TCM). These codes have been generally adapted in multiple access technologies, ranging from 2G/3G wireless systems, satellite communication systems, IEEE 802.11/15/16, local area network (LAN), personal area network (PAN), wide area network (WAN), digital subscriber line (DSL), cable/hybrid fiber coaxial (HFC) cable, and power line multiple access. These codes are also adapted to handle data rates dynamically from a few kilobits (small packets) to hundreds of megabits (large packets).

FIG. 1 is a block diagram illustrating a prior art uplink process where a base station 200 communicates with several users at a user side 100 at the same time. The base station 200 of this architecture typically uses commercially available digital signal processor (DSP), field-programmable gate array (FPGA), application-specific specific integrated circuit (ASIC), and application-specific signal processor (ASSP) devices that can handle multiple users and/or multiple data streams at the same time. FIG. 1 illustrates three (3) users, a first user user1 may have two applications using two separate data streams data1 and data2, while second and third users user2 and user3 may each have one application using one data stream data3 and data4, respectively, for each application. At the user side 100, each data stream for each user is encoded by separate encoders 10. A first encoded data stream for the first user user1 and the second encoded data stream for the first user user1 are individually modulated by respective modulators 12, and then the modulated first and second data streams are combined by a combiner 14. The combined data stream is transmitted to the base station 200 through a channel (e.g., over the air). Each data stream for the second and third users user2 and user3 is individually modulated by a modulator 12, and individually transmitted through a channel to the base station 200. The order of processing may change depending on specific technologies (e.g., 3GPP2 follows the order illustrated in FIG. 1, while in 3GPP, the order of "combine" and "modulate" may be swapped).

At the base station 200, the combined data stream for the first user user1 is demodulated by demodulators 16 to produce soft symbols. The modulated data stream for each of the second and third users user2 and user3 is also demodulated by respective demodulators 16, to produce soft symbols. The soft symbols are then stored in a queue 18, and scheduled by a control function (not shown) to time-share a decoder 20.

Given the architecture shown in FIG. 1, generally, designing a decoder 20 to handle a wide range of data rates is beneficial. Such decoders 20 are designed to handle the worst-case scenario, which is a code with the largest block size, the highest constraint length, and the lowest rate. However, such a conventional decoder 20 is inefficient in handling smaller size code blocks.

To better understand this efficiency issue, well-known turbo and convolutional encoding and decoding will be described. FIG. 2 illustrates a prior art 3GPP rate—⅓ turbo code encoder. The turbo encoder of FIG. 2 consists of first and second eight state rate—½ systematic convolutional encoders 30-1, 30-2. A data stream $X_k$ is input to the first constituent encoder 30-1 to produce a parity one bit $Z_k$ for each input bit. For example, a code block size of the data stream may be between 40 bits to 5114 bits long. The data stream $X_k$ is also input to an internal interleaver 40 to produce interleaved data stream $X'_k$. The interleaved data stream $X'_k$ is input to the second constituent encoder 30-2. The second constituent encoder 30-2 produces a parity two bit $Z'_k$.

Each of the first and second constituent encoders 30-1, 30-2 has the same structure. Accordingly, for the sake of brevity, the structure of only one of the constituent encoders 30-1, 30-2 will be described. As shown, each of the constituent encoders 30-1, 30-2 includes a switch 50, first-third registers 60-1 to 60-3 connected in series, and first-fourth adders 62-1 to 62-4. The first adder 62-1 adds the output of the second and third registers 60-2 and 60-3. The second adder 62-2 adds the output of the first adder 62-1 with the data stream selectively input by the switch 50. The switch 50 selectively inputs the data stream based on the output of the first adder 62-1. The third adder 62-3 adds the output of the second adder 62-2 and the output of the first register 60-1. The fourth adder 62-4 adds the outputs of the third adder 62-3 and the third register 60-3 to generate the parity bit $Z_k$. The output of the switch 50 supplies the data stream $X_k$. In the second constituent encoder 30-2, the second parity bits $Z'_k$ and the interleaved data stream $X'_k$ are supplied in the same manner.

The transfer function of the 8-state constituent code for parallel concatenated convolutional code (PCCC) is:

$$G(D) = \left[1, \frac{g_1(D)}{g_0(D)}\right],$$

where $g_0(D) = 1 + D^2 + D^3$, $g_1(D) = 1 + D + D^3$.

The initial value of shift registers 60-1 to 60-3 of the first and second constituent encoders 30-1, 30-2 should be zeros when encoding the data streams $X_k$, $X'_k$. Output from the encoders is:

$X_1, Z_1, Z'_1, X_2, Z_2, Z'_2, \ldots, X_k, Z_k, Z'_k$, where $X_1, X_2, \ldots, X_k$ are the systematic bits $s_k$ for decoding, k is a number of bits in the input data stream block, and $Z_1, Z_2, \ldots, Z_k$ and $Z'_1, Z'_2, \ldots, Z'_k$ are the parity one bits $p_k$ and parity two bits and $p'_k$, respectively, used in the decoding process. As described above, the data streams output from the internal interleaver 40 are denoted by $X'_1, X'_2, \ldots, X'_k$, and these data streams are to be input to the second encoder 30-2. These bits may not be transmitted for decoding.

Each constituent code termination is performed at the end of the input data block by taking tail symbols from registers 60-1 to 60-3 feedback after all data stream bits are encoded. Tail symbols are padded after the encoding of the data stream bits. After code termination, the constituent encoder is in all-zero state.

The first three tail symbols are used to terminate the first constituent encoder 30-1 while the second constituent encoder 30-2 is disabled. For example, here the switch 50 in the first constituent encoder 30-1 is in a low position. The last three tail symbols are used to terminate the second constituent encoder 30-2 while the first constituent encoder 30-1 is disabled, for example, the switch 50 in the first constituent encoder 30-1 is in a high position.

The transmitted bits for constituent code termination are:
$X_{k+1}, Z_{k+1}, X_{k+2}, Z_{k+2}, X_{k+3}, Z_{k+3}, X'_{k+1}, Z'_{k+1}, X'_{k+2}, Z'_{k+2}, X'_{k+3}, Z'_{k+3}$ Well-known decoding of a constituent code may be an iterative method using a structure as illustrated in FIG. 3. The decoding works along each individual constituent code and decodes them individually. As shown, inputs to a first constituent decoder 70-1 may include the systematic bits $s_k$, and the parity bits $p_k$ from the first constituent encoder 30-1 and deinterleaved extrinsic information Extrinsic 2,k from a deinterleaver 95 (discussed below). The first constituent decoder 70-1 generates a first log-likelihood ratio $LLR_{1,k}$ based on the respective systematic bits $s_k$, parity one bits $p_k$, and second extrinsic information Extrinsic 2,k. As is known, the first constituent decoder 70-1 also generates extrinsic information Extrinsic 1,k. The inputs to the second decoder 70-2 may include the interleaved systematic bit $s'_k$, the parity bit $p'_k$ from the second encoder 30-2 and the interleaved first extrinsic information Extrinsic '1,k. A first interleaver 90-1 interleaves the systematic bits $s_k$ to generate interleaved systematic bits $s'_k$, and a second interleaver 90-2 interleaves the first extrinsic information Extrinsic 1,k to generate interleaved Extrinsic information Extrinsic' 1,k. The second constituent decoder 70-2 generates a second log-likelihood ratio $LLR_{2,k}$ based on the respective interleaved systematic bits $s_k$, the parity two bits $p'_k$, and first interleaved extrinsic information Extrinsic' 1,k. The second constituent decoder 70-2 also generates second interleaved extrinsic information Extrinsic' 2,k. A deinterleaver 95 deinterleaves this information to generate the second extrinsic information Extrinsic 2,k.

The iterative process may be stopped at the end of the second constituent decoder 70-2 after a number of iterations, where the incremental decoding gain may be insignificant. Here, one iteration means the execution of the first constitute decoder 70-1 followed by the second constitute decoder 70-2. The average number of iterations is generally between 6 and 12. The final decision on each systematic bit is made on the sign of the $LLR_{2,k}$ output. In the decoding process, the LLRs of tail systematic symbols are not calculated in either constituent decoder, nor are decisions made on these tail systematic symbols. This is simply because the tail symbols from one constituent code are not recognizable by the other constituent code, therefore the other constituent decoder cannot take advantage of the LLRs of the tail systematic symbols from this constituent decoder.

As explained above, a decoder has to be designed for the worst-case scenario. In other words, a decoder has to be designed to handle (1) a code block size of, for example, 5114 bits with (2) a fixed amount of processing time. To handle the worst case code block size, the decoder is typically designed to reserve enough storage units in the interleaver/deinterleaver, for example, to handle a code block size of 5114 bits. To deal with the fixed amount of processing time, a code block may be divided into overlapping smaller blocks and processed simultaneously.

FIG. 4 illustrates breaking a code block into overlapping sub-blocks for parallel processing to meet this processing time requirement. For example, a code block of length 8K is divided into 6 overlapping sub-blocks, each of length 3K. The 6 sub-blocks can be processed in parallel, and the results, which correspond to the darker blocks in the sub-blocks of FIG. 4 are re-assembled after a metric calculation to give back the 8K block metrics. Since each parallel processed sub-block has a processing size of 3K instead of 8K, the processing time is shortened roughly by a factor of 8/3=2.67. The more sub-blocks the data can be broken into (down to some limit imposed by the code constraint length to guarantee perfor-mance), the faster the code block can be decoded. For 3GPP turbo code, if each sub-block length is as low as 128, there may be more than 100 sub-blocks. On the other hand, the more sub-blocks that need to be processed simultaneously, the more complex the hardware (real-estate, clock frequency, control logic, etc). Therefore, a balance is struck between decoding time and hardware complexity. A realistic number of sub-blocks is generally under 16.

Accordingly, the parallel processing can only be utilized marginally if a code block size is in a range of a sub-block size, leaving the rest of the parallel processing engines idle.

SUMMARY OF THE INVENTION

In a multiple access environment, to improve decoding efficiency for small code blocks, multiple code blocks may be concatenated to form a single large code block. Example embodiments of the present invention may concatenate code blocks for turbo codes. Example embodiments of the present invention may also concatenate code blocks for convolutional code. Example embodiments of the present invention also disclose a system to concatenate the code blocks.

In an example embodiment of the present invention, a method of decoding a code block includes concatenating a first code block and a second code block to form a concatenated code block, and decoding the concatenated code block. Guard symbols or bits may be inserted between the first and second code blocks.

In another example embodiment of the present invention, a system for concatenating code blocks includes a concatenation unit to concatenate a first code block and a second code block, and a decoder to decode the concatenated code block. The concatenation unit may insert guard symbols or bits between the first and second code blocks. A decoder (e.g., turbo, Viterbi, etc.) then decodes the concatenated code block.

BRIEF DESCRIPTION OF THE DRAWINGS

FIG. 8 illustrates two turbo encoded code blocks concatenated together according to still another example embodiment of the present invention; and FIG. 9 illustrates two turbo encoded code blocks concatenated together according to another example embodiment of the present invention.

DETAILED DESCRIPTION OF EXAMPLE EMBODIMENTS

In example embodiments of the present invention, in a multiple access environment, it may be possible to improve decoder efficiency by concatenating smaller code blocks to form a larger single code block for decoding. Accordingly, code blocks of one or more users may be decoded at once with little or no significant increase in decoding time.

Code Block Concatenation for Turbo Code-I

To better understand example embodiments of the present invention, Third Generation Partnership Project (3GPP) turbo codes will be used as an example, but the example embodiments of the present invention are not limited to 3GPP turbo codes.

Figure 5:
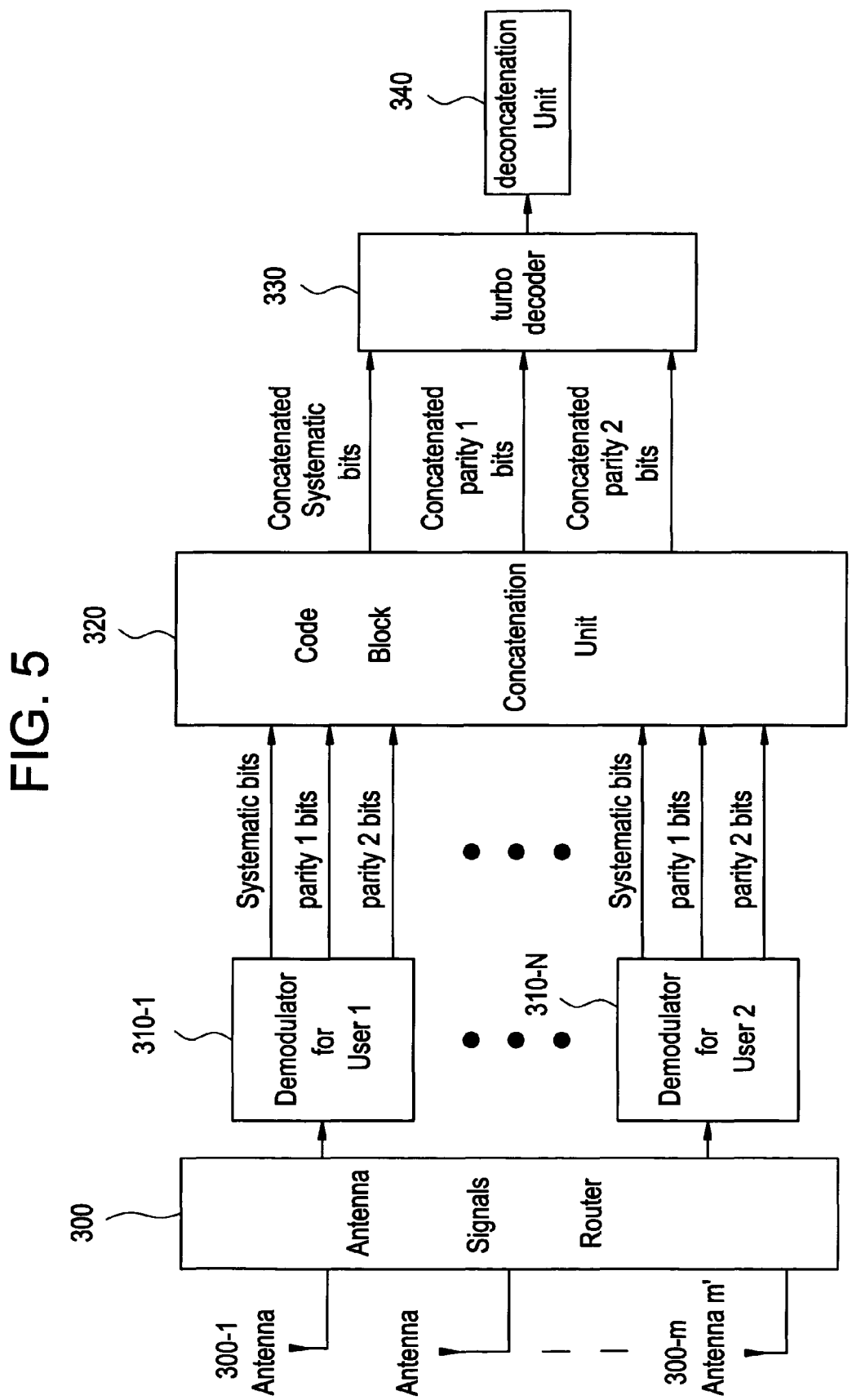
FIG. 5 illustrates a system for concatenating code blocks according to an example embodiment of the present invention.

FIG. 5 illustrates a system to concatenate code blocks according to an example embodiment of the present invention. In FIG. 5, code blocks, for example, multiple data streams are received by an antenna signals router 300 having a plurality of antennae 300-1, 300-2 . . . 300-$m$. Respective demodulators 310-1 to 310-$n$ demodulate the data streams of each user to produce systematic bits, parity one bits, and parity two bits for each data stream. A concatenation unit 320 selectively concatenates these bits. In other words, multiple code blocks may be concatenated together to form a single larger code block. The concatenation unit 320 may be implemented by hardware or software (e.g., software in a DSP). The concatenated systematic bits, concatenated parity one bits, and concatenated parity two bits are sent to a turbo decoder 330 for turbo decoding. The turbo decoder 330 may be any well-known turbo decoder.

The turbo decoder 330 accepts soft symbols corresponding to concatenated blocks, processes them without external intervention and sends back binary decisions on each systematic bit in a code block. Such a turbo decoder may be implemented as a standalone in an application specific integrated circuit (ASIC) device, a stand-alone ASIC block in a bigger field-programmable gate array (FPGA), or as application-specific signal processor (ASSP) devices. The binary decisions from the turbo decoder 330 (i.e., decision blocks) may be de-concatenated by a de-concatenated unit 340.

Figure 6:
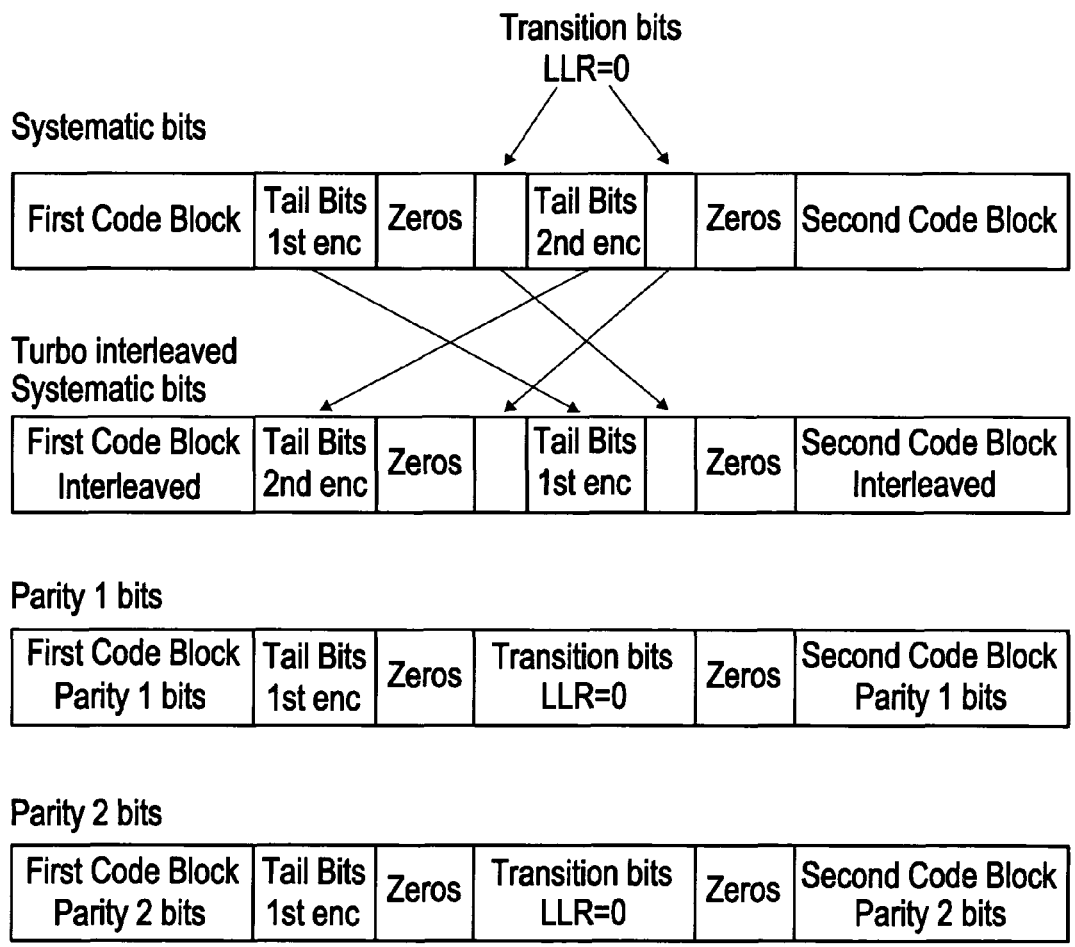
FIG. 6 illustrates two turbo encoded code blocks concatenated together according to an example embodiment of the present invention.

FIG. 6 illustrates a concatenated systematic code block stream, a concatenated systematic code block after turbo interleaving stream, a concatenated parity one bit stream, and a concatenated parity two bit stream produced by the concatenation unit 320 according to an embodiment of the present invention.

The number of code blocks that may be concatenated together to form a single larger code block depends on a maximum allowed block size by the turbo decoder 330. For purposes of explanation, FIG. 6 illustrates two code blocks concatenated together, however, the number of code blocks concatenated may be varied.

Each code block, at the output of a turbo encoder consists of three streams multiplexed together: systematic bits, parity one bits from a first constituent encoder, and parity two bits from a second constituent encoder. FIG. 6 illustrates these three code block streams for the concatenation of two code blocks and also shows the turbo interleaved systematic bits code block stream generated during the turbo decoding process.

As shown in FIG. 6, for the concatenated systematic code block, the concatenation unit 320 concatenates: the LLR of the bits of the first code block; the LLR of the tail bits output from the first constituent encoder for the first code block; a first string of zeros (the LLR value of a logic "zero" bit, is the maximum positive value, or the maximum negative value depending on the design of the Turbo decoder); first guard bits (or transition bits); the LLR of the tail bits of the second constituent encoder for the second code block; second guard bits (or transition bits); a second string of zeros; and the LLRs of the bits of the second code block.

Tail bits of the first and second constituent encoders, which are required to return each of the two constituent encoders to the zero-state, are inserted in the concatenated code block to assist in the decoding of the concatenated code block by the turbo decoder. The tail bits consist of three systematic bits and three parity bits for each constituent encoder. The tail systematic bits for the first constituent encoder are different from those of the second constituent encoder, and therefore, must be explicitly transmitted. In other words, both the tail systematic bits for the first and second constituent encoders are transmitted.

Surrounding the tail bits of the second constituent encoder for the first code block and inserted between the two zero blocks are the first and second guard or transition bits. Such transition bits allow the state of the decoder to ramp up from the zero state and down again to the zero state. This minimizes the cross-effect of errors between code blocks. The actual value of the transition bits depends on the tail bits. The LLR of the transition bits is set to zero. During decoding, the turbo interleaver switches the position of the tail bits as shown in the turbo interleaved systematic bit code block stream in FIG. 6 (described below). The parity one and parity two bits during the transition period also have their LLR set to "0". This is shown in the parity one and parity two bit streams.

As mentioned above, a turbo interleaver interleaves the concatenated systematic code block by switching the position of the tail bits of the first constituent encoder and the second constituent encoder. Since, the tail bits of the second constituent encoder are inserted into the concatenated systematic code block, transition bits are used to return the first constituent decoder to the zero state. Similarly, after turbo interleaving, the tail bits of the first constituent encoder are inserted into the interleaved concatenated code block passed to the second constituent decoder. Hence, transition bits are used to return the second constituent decoder to a zero-state.

As also shown in FIG. 6, for the concatenated parity one bits stream, the concatenation unit 320 concatenates: the LLR of the bits of the first code block parity one bits; the LLR of the tail bits output from the first constituent encoder for the first code block; a first string of zeros (the LLR value of a logic "zero" bit, is the maximum positive value, or the maximum negative value depending on the design of the Turbo decoder); guard (or transition) bits; a second string of zeros; and the LLRs of the bits of the second code block parity one bits.

And also shown in FIG. 6, for the concatenated parity two bits stream, the concatenation unit 320 concatenates: the LLR of the bits of the first code block parity two bits; the LLR of the tail bits output from the second constituent encoder for the first code block; a first string of zeros (the LLR value of a logic "zero" bit, is the maximum positive value, or the maximum negative value depending on the design of the Turbo decoder); guard (or transition) bits; a second string of zeros; and the LLRs of the bits of the second code block parity two bits.

Code Block Concatenation for Turbo Code-II

Figure 7:
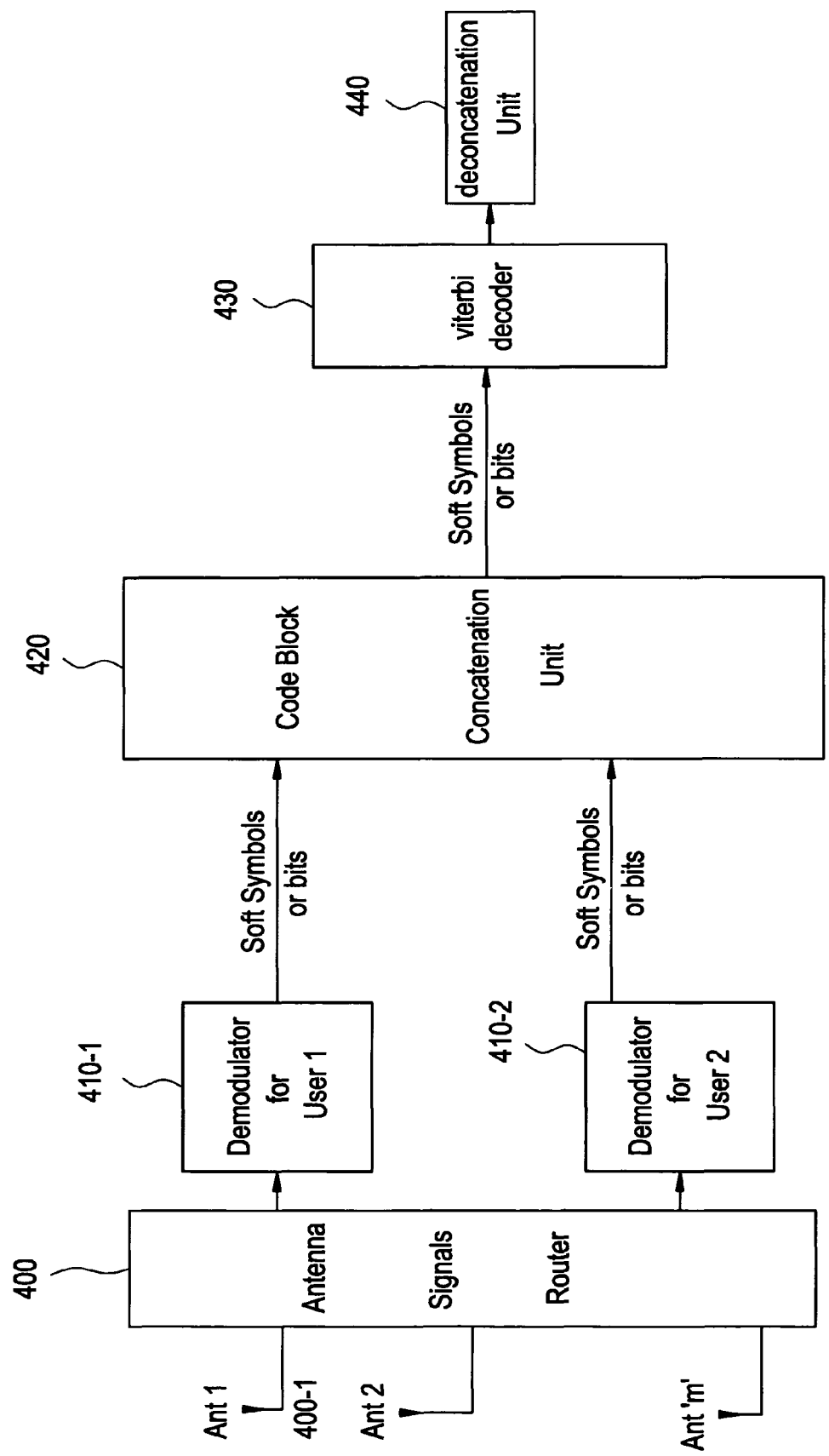
FIG. 7 illustrates a system for concatenating code blocks according to another example embodiment of the present invention.

FIG. 7 illustrates a system to concatenate code blocks according to another example embodiment of the present invention. In FIG. 7, for example, multiple data streams are received by an antenna signals router 400 having a plurality of antennae 400-1, 400-2 . . . 400-$m$. Respective demodulators 410-1 to 410-$n$ demodulate the data streams of each user to produce soft bits or symbols (e.g., one or more bits may form a symbol). A concatenation unit 420 selectively concatenates these soft symbols. The concatenation unit 420 concatenates the soft symbols by hardware or software (e.g., software in a DSP). The concatenated soft symbols are sent to a Viterbi decoder 430 for decoding. The concatenated soft symbols may be de-concatenated by a de-concatenated unit 440.

Figure 1:
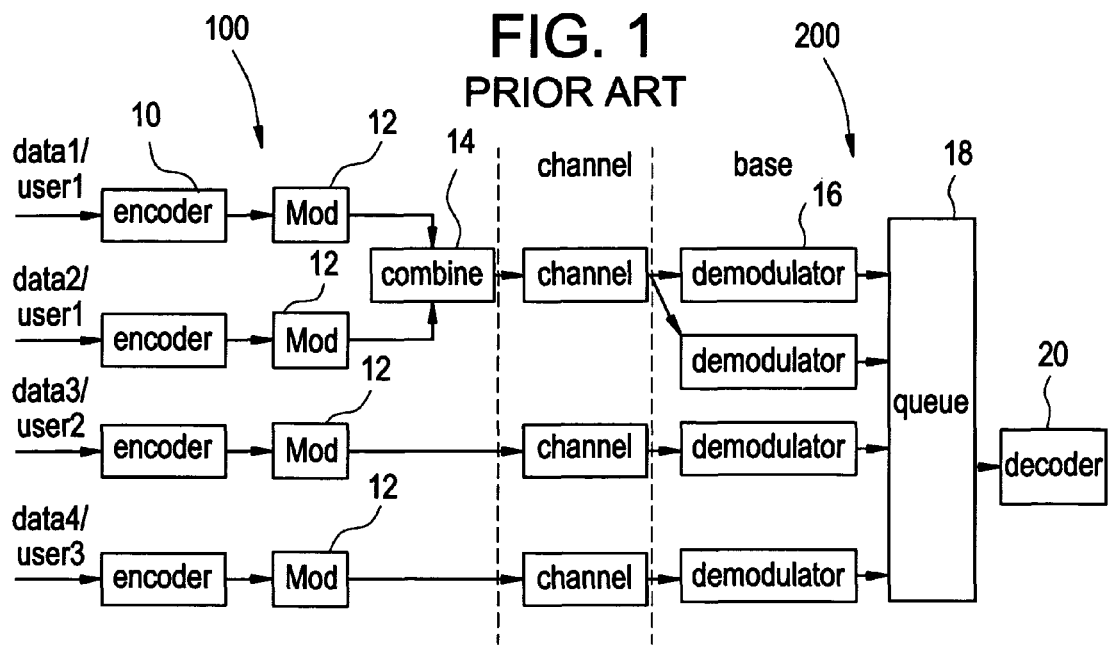
FIG. 1 illustrates a block diagram of a prior art uplink processing architecture.
Figure 2:
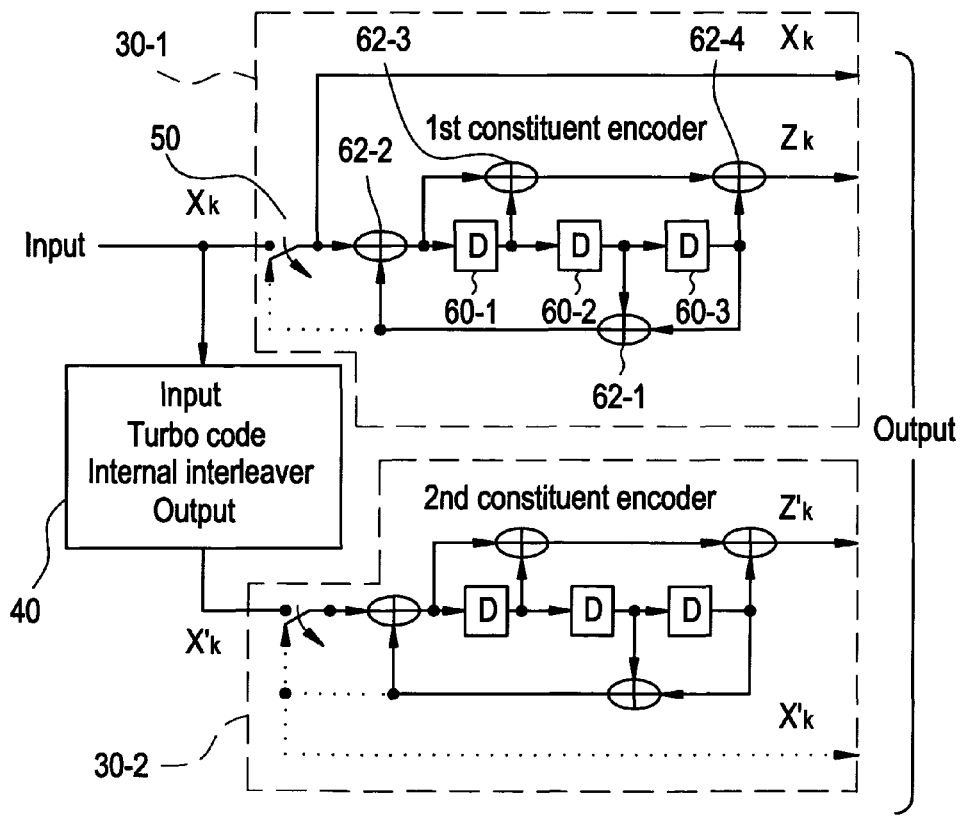
FIG. 2 illustrates a prior art rate—⅓ turbo encoder.
Figure 3:
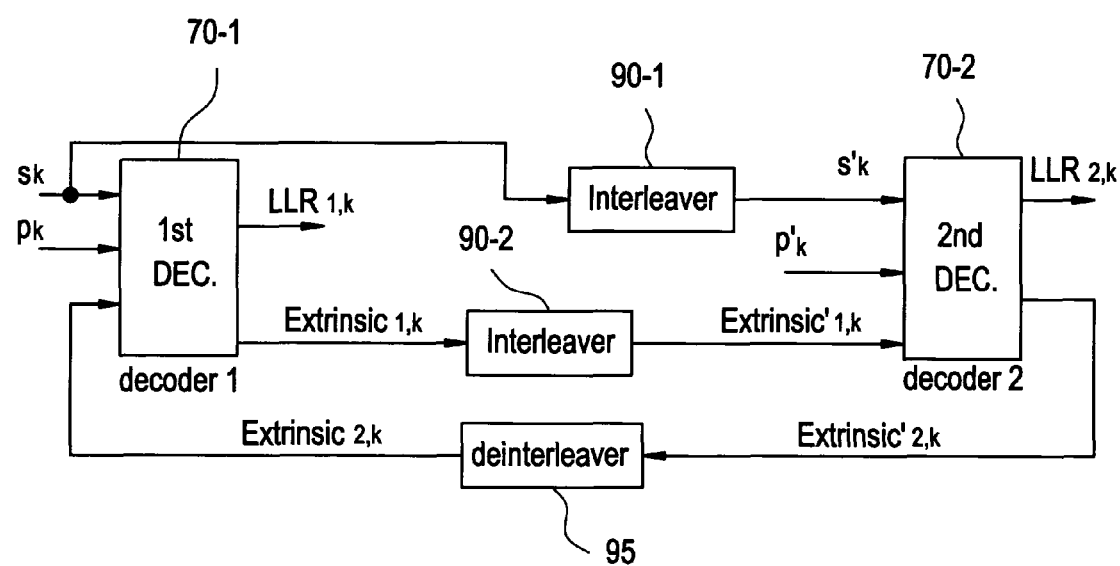
FIG. 3 illustrates a prior art decoder.
Figure 4:
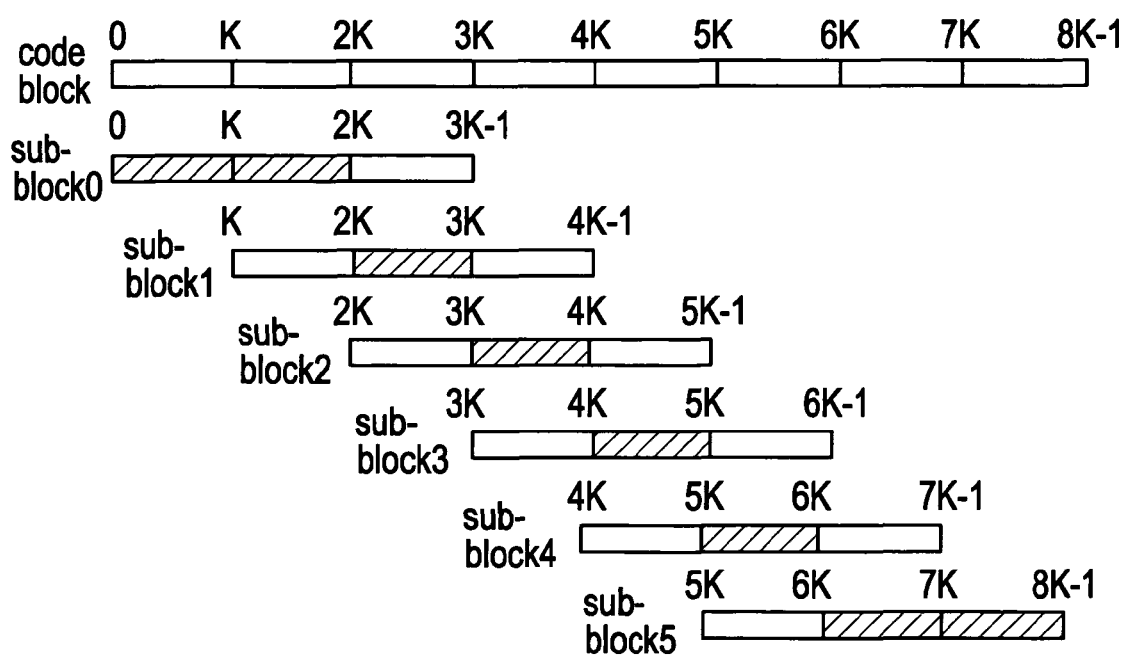
FIG. 4 illustrates an example of breaking a code into overlapping sub-blocks for parallel processing.

In this example embodiment of the present invention, it is assumed that access is available to the individual processing blocks shown in FIG. 3. Such an implementation is seen when a decoder is implemented in digital signal processor (DSP) devices, field-programmable gate array (FPGA) devices or even application-specific standard product (ASSP) devices, which have more flexibility for the end users to implement their own internet protocols. The number of code blocks that can be concatenated may be limited to an interleaver/deinterleaver size inside a decoder.

FIGS. 8a and 8b illustrate concatenation of two code blocks for systematic bits and parity bits, respectively, using the exemplary LLR and extrinsic values disclosed above with respect to the metric calculation block shown FIG. 3.

In FIG. 8a, soft bits or symbols for different code blocks, for example, code block 1 systematic bits and code block 2 systematic bits, are separated by guard bits with preset soft symbol (systematic) LLR values and extrinsic values. In FIG. 8b, soft bits or symbols for different code parity blocks, for example, code block 1 parity bits and code block 2 parity bits, are separated by guard bits with preset soft symbol (parity) LLR values and extrinsic values. The number of guard bits (systematic) may be determined as:

(constituent_code_constraint_length−1)*constituent_code_rate.

In 3GPP, 6 would be the number of determined guard bits. The LLR values for each group of guard bits is set to a maximum (in amplitude) value allowed by a data representation (this is vendor-specific) that indicates a bit "0." The extrinsic value for the guard systematic soft bits is also set to a maximum (in amplitude) value allowed by the data representation (vendor-specific) that indicates a bit "0." For example, if the LLR is defined as a ratio between bit=1 over bit=0, then bit 0 is indicated by negative numbers. If the LLR of each bit is represented by a 5-bit number with 2 fractional bits, the LLR for the guard bits is set to −8. In the meantime, if the extrinsic information is represented by a 6-bit number with 1 fractional bit, values for the guard systematic bits is set to −32.

Code Block Concatenation for Convolutional Code

In another example embodiment of the present invention, concatenation of convolutionally coded blocks is similar to the code block concatenation for turbo code-II, but without extrinsic values.

FIG. 9 illustrates the concatenation of two code blocks, using the exemplary LLR values above, for a rate ½ convolutional code. It will be understood that code blocks with different mother code rates cannot be concatenated. However, code blocks with different code rates, but derived from the same mother code, may be concatenated. The number of code blocks that may be concatenate is unlimited. Soft bits or symbols associated with different code blocks, for example, code block 1 and code block 2, are separated by guard bits with preset soft symbols LLR values. The number of guard bits may be:

(mother_code_constraint_length−1)*mother_code_rate.

In 3GPP, the determined number of guard bits is 16 for a rate ½ code and 24 for a rate ⅓ code. The LLR values for each group of guard bits are set to a maximum (in amplitude) value allowed by a data representation (this is vendor-specific) that indicates a bit "0." For example, if the LLR is defined as a ratio between bit=1 over bit=0, then bit 0 is indicated by negative numbers. If the LLR of each bits is represented by a 5-bit number with 2 fractional bits, the LLR for the guard bits is set to −8.

In a multiple access environment, to improve decoding efficiency for small code blocks by a decoder, multiple code blocks may be concatenated to form a single large block prior to decoding. For example, by concatenating code blocks together to obtain a concatenated code block size that most closely approaches the maximum code block size of the decoder, more efficient decoding may be performed.

The invention being thus described, it will be obvious that the same may be varied in many ways. For example, while an example implementation of the present invention has been described with respect to a Third Generation Partnership Project (3GPP) system, it will be appreciated that the present invention is applicable to other standard based systems. Such variations are not to be regarded as a departure from the invention, and all such modifications are intended to be included within the scope of the invention.

What is claimed is:

1. A method of decoding a code block, comprising:
concatenating, at a receiver, a first code block that is at least a part of a data stream from a first user, and a second code block that is at least a part of a data stream from a second user, to form a concatenated code block, at least one set of guard bits being inserted between the first and second code blocks, the concatenated code block including at least one string of zeros between the guard bits and at least one of the first and second code blocks, and the number of guard bits in the at least one set of guard bits being based on a size of the concatenated code block; and
decoding, at the receiver, the concatenated code block in a single decode operation.

2. The method of claim 1, wherein each of the first and second code blocks includes systematic bits, parity one bits, and parity two bits.

3. The method of claim 1, wherein the concatenated code block includes concatenated systematic bits, parity one bits, and parity two bits.

4. The method of claim 3, wherein the decoding of the concatenated code block is a Turbo decoding.

5. The method of claim 1, wherein each of the first and second code blocks includes soft symbols.

6. The method of claim 5, wherein the concatenated code block includes concatenated soft symbols.

7. The method of claim 6, wherein the decoding of the concatenated code block is a Viterbi decoding.

8. The method of claim 6, wherein at least one set of guard bits are inserted between the first and second code blocks.

9. The method of claim 8, wherein the guard bits have a Log-likelihood ratio (LLR) value of zero.

10. The method of claim 1, wherein the guard bits have a Log-likelihood ratio (LLR) value of zero.

11. The method of claim 1, wherein at least one set of tail bits are inserted between the first code block and the at least one set of guard bits.

12. The method of claim 11, wherein the guard bits are inserted on both sides of the at least one set of tail bits.

13. The method of claim 1, wherein a size of the concatenated code block is less than or equal to a largest code block size that a decoder in the receiver can decode.

14. The method of claim 1, wherein
the decoding step decodes the concatenated code block using a decoder in the receiver, the decoder configured to decode code blocks up to a maximum code block size; and the concatenating step concatenates the code blocks to obtain a concatenated code block size that most closely approaches the maximum code block size.

15. A method of forming a concatenated code block at a radio device, comprising:
  concatenating, at a receiver,
    a first code block that is at least a part of a data stream from a first user,
    a second code block that is at least a part of a data stream from a second user,
    at least one set of guard bits between the first and second code blocks, and
    at least one string of zeros between the guard bits and at least one of the first and second code blocks, wherein the number of guard bits in the at least one set of guard bits is based on a size of the concatenated code block.

16. The method of claim 15, wherein the guard bits have a Log-likelihood ratio (LLR) value of zero.

17. A method of forming a concatenated code block at a radio device, comprising:
  concatenating, at a receiver,
    a first code block that is at least a part of a data stream from a first user,
    a second code block that is at least a part of a data stream from a second user,
    at least one set of guard bits between the first and second code blocks, and
    at least one string of tail bits between the first code block and the at least one set of guard bits, wherein the number of guard bits in the at least one set of guard bits is based on a size of the concatenated code block.

18. The method of claim 17, wherein the guard bits are inserted on both sides of the at least one set of tail bits.

* * * * *

UNITED STATES PATENT AND TRADEMARK OFFICE
CERTIFICATE OF CORRECTION

| | | |
|---|---|---|
| PATENT NO. | : 8,271,848 B2 | Page 1 of 1 |
| APPLICATION NO. | : 11/398535 | |
| DATED | : September 18, 2012 | |
| INVENTOR(S) | : Bresalier et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1236 days.

Signed and Sealed this
Sixteenth Day of September, 2014

Michelle K. Lee
*Deputy Director of the United States Patent and Trademark Office*